United States Patent [19]

Blazo

[11] Patent Number: 5,742,208
[45] Date of Patent: Apr. 21, 1998

[54] SIGNAL GENERATOR FOR GENERATING A JITTER/WANDER OUTPUT

[75] Inventor: Stephen F. Blazo, Portland, Oreg.

[73] Assignee: Tektronix, Inc., Wilsonville, Oreg.

[21] Appl. No.: 709,024

[22] Filed: Sep. 6, 1996

[51] Int. Cl.$^6$ .............................. H03B 29/00; H03L 7/06; H03L 7/18

[52] U.S. Cl. .................... 331/23; 331/2; 331/17; 331/18; 331/78; 327/156

[58] Field of Search .................... 331/1 A, 2, 17, 331/18, 23, 25, 78; 327/105, 106, 147–150, 156–159, 164; 332/127, 128

[56] References Cited

U.S. PATENT DOCUMENTS

| | | | |
|---|---|---|---|
| 5,325,075 | 6/1994 | Rapeli | 332/103 |
| 5,351,014 | 9/1994 | Ichiyoshi | 331/1 A |
| 5,424,688 | 6/1995 | Phillips | 331/16 |
| 5,428,308 | 6/1995 | Maeda | 327/106 |

*Primary Examiner*—David Mis
*Attorney, Agent, or Firm*—William K. Bucher

[57] ABSTRACT

A signal generator has a variable reference oscillator, a variable oscillator and a phase locked loop for generating an output having jitter and wander. The variable reference oscillator generates a reference having a varying phase offset over a first phase modulation frequency interval and a constant output over a second phase modulation frequency interval. The variable oscillator generates a constant output over the first phase modulation frequency interval and a variable output over the second phase modulation frequency interval. The phase locked loop includes a phase detector, a phase summing node and oscillator with the phase detector coupled to receive the outputs of the variable reference oscillator and the oscillator, and phase summing node coupled to receive the outputs of the variable oscillator and the phase detector. The output of the phase locked loop tracks the variable reference oscillator over the first phase modulation frequency interval and generates a phase modulated output in response to the variable output of the variable oscillator over the second phase modulation frequency interval.

12 Claims, 5 Drawing Sheets

| STM LEVEL | PEAK-TO-PEAK AMPLITUDE (UNIT INTERVAL) | | | | | FREQUENCY (Hz) | | | | | | | | | | |
|---|---|---|---|---|---|---|---|---|---|---|---|---|---|---|---|---|
| | $A_0$ (18μS) | $A_1$ (2μS) | $A_2$ (0.25μS) | $A_3$ | $A_4$ | $f_0$ | $f_{12}$ | $f_{11}$ | $f_{10}$ | $f_9$ | $f_8$ | $f_1$ | $f_2$ | $f_3$ | $f_4$ |
| STM-1 | 2800 | 311 | 39 | 1.5 | 0.15 | 12μ | 178μ | 1.6m | 15.6m | 0.125 | 19.3 | 500 | 6.5k | 65k | 1.3m |
| STM-4 | 11200 | 1244 | 156 | 1.5 | 0.15 | 12μ | 178μ | 1.6m | 15.6m | 0.125 | 9.65 | 1000 | 25k | 250k | 5m |
| STM-16 | 44790 | 4977 | 622 | 1.5 | 0.15 | 12μ | 178μ | 1.6m | 15.6m | 0.125 | 12.1 | 5000 | UNDER STUDY (NOTE 1) | | 20m |

| $f_0$ | $f_{10}$ | $f_9$ | $f_8$ | $f_1$ | $f_2$ | $f_3$ | $f_4$ | PSEUDO-RANDOM TEST-SIGNAL |
|---|---|---|---|---|---|---|---|---|
| $1.2 \times 10^{-5}$ Hz | a) | a) | a) | 20Hz | 600Hz | 3kHz | 20kHz | $2^{11}-1$ |
| $1.2 \times 10^{-5}$ Hz | $4.88 \times 10^{-3}$Hz (NOTE 7) | 0.01Hz (NOTE 7) | 1.667Hz (NOTE 7) | 20Hz | 2.4kHz (93Hz) | 18kHz (700Hz) | 100kHz | $2^{15}-1$ (REC. 0.151) |
| $1.2 \times 10^{-5}$ Hz | a) | a) | a) | 20Hz | 400Hz (10.7kHz) | 3kHz (80kHz) | 400kHz | $2^{15}-1$ (REC. 0.151) |
| a) | a) | a) | a) | 100Hz | 1kHz | 10kHz | 800kHz | $2^{23}-1$ (REC. 0.151) |
| a) | a) | a) | a) | 200Hz | 500Hz | 10kHz | 3500kHz | $2^{23}-1$ (REC. 0.151) |

FREQUENCY (Hz)

FIG. 6B

FROM FIG. 6A

| DIGIT RATE kBIT/S) | PEAK-TO-PEAK AMPLITUDE (UNIT INTERVAL) | | | |
|---|---|---|---|---|
| | $A_0$ | $A_1$ | $A_2$ | $A_3$ |
| 64 (NOTE 1) | 1.15 (18μS) | a) | 0.25 | 0.05 |
| 2.048 | 36.9 (18μS) | 18 (NOTE 7) | 1.5 | 0.2 |
| 8.448 | 152 (18μS) | a) | 1.5 | 0.2 |
| 34.368 | 618.6 (18μS) | a) | 1.5 | 0.15 |
| 139.264 | 2506.6 (18μS) | a) | 1.5 | 0.075 |

TO FIG.6B

SIGNAL GENERATOR FOR GENERATING A JITTER/WANDER OUTPUT

TECHNICAL FIELD

The present invention relates generally to signal generators and more specifically to a signal generator for generating an output having phase modulation representing jitter and wander on a digital signal and/or frequency offset.

BACKGROUND OF THE INVENTION

Telecommunications networks have evolved dramatically during the 20th century to the point where they include worldwide satellite, microwave, and fiber-optic links for transporting data and video services in addition to voice. Starting with analog Plain Old Telephone Service (POTS), the telecommunications industry moved into asynchronous digital systems in the 1950's. The digital systems' hierarchy use digital signals, labeled DS as the building blocks. The fundamental rate is DS0, which is a single voice channel at 64 Kilobytes per second (Kbps). A DS1 has 24 voice channels plus house keeping bits equalling 1.544 Megabytes per sec (Mbps). Table 1 below shows the levels and bit rates for established DSs:

TABLE 1

| DS | Bit Rate |
|---|---|
| DS0 | 64 Kbps |
| DS1 | 1.544 Mbps |
| DS1C | 3.152 Mbps |
| DS2 | 6.312 Mbps |
| DS3 | 44.736 Mbps |
| DS4E | 139.264 Mbps |
| DS4 | 274.176 Mbps |

The European Conference of Postal and Telecommunications Administration (CEPT) adapted an equivalent asynchronous digital standard, called Pleisochronous Digital Hierarchy (PDH), with rates shown in Table 2:

TABLE 2

| |
|---|
| 64 Kbps |
| 2.048 Mbps |
| 8.448 Mbps |
| 34.368 Mbps |
| 139.263 Mbps |

The growth in fiber-optic network links has been particularly rapid since the 1970's and has contributed to a dramatic improvement in network reliability, bandwidth, and quality.

However, the first generations of fiber-optic telecommunications systems relied on proprietary architectures, equipment, line codes, multiplexing formats, and maintenance procedures. The providers of these systems wanted standards so they could mix and match equipment from a variety of suppliers. Accordingly, in the late 1980s, the Exchange Carriers Standards Association and the International Telegraph and Telephone Consultative Committee developed a single international standard referred to as the Synchronous Digital Hierarchy (SDH).

SDH is a data transport system, generally implemented using fiber optics, that establishes a wideband transmission technology for worldwide telecommunications networks. The Synchronous Optical Network (SONET) is its implementation in the United States. The comprehensive SDH/SONET standard is expected to provide the transport infrastructure for worldwide telecommunications well into the 21st century.

SDH/SONET has the same ease of use as the conventional telephone network system; however, its improved configuration flexibility and bandwidth provide significant advantages over the current system. These include the ability to multiplex voice, data, and video signals into a broadband synchronous channel in which individual data bytes can be easily and uniquely identified; reduced equipment requirements; increased network reliability; and a provision for overhead and payload bytes in which the overhead bytes permit management of the payload bytes.

SDH/SONET employs a byte interleaved multiplexing scheme for conveying multiple signals of differing capacities through a synchronous, flexible, optical hierarchy. Byte interleaving simplifies multiplexing and provides an end-to-end network management capability. The SDH/SONET multiplexing process first employs the generation of a lowest level or base signal that is referred to as the Synchronous Transport Signal level-1 (STS-1), which operates at 51.84 Mbps. Higher level signals (STS-N) are integer multiples of STS-1, resulting in a family of STS-N signals as shown in Table 1. An STS-N signal includes N byte-interleaved STS-1 signals. Table 3 also shows an optical counterpart for each STS-N signal, designated Optical Carrier level-N (OC-N). In SDH, the base signal is referred to as Synchronous Transport Module level-1 (STM-1), which operates at 155.52 Mbps. Higher level signals (STM-N) are multiples of the base rate.

TABLE 3

| SDH/SONET Signal Hierarchy | | | |
|---|---|---|---|
| Data Rate (Mbps) | CCITT Designation | Electrical Signal | Optical Signal |
| 51.84 | STM-0 | STS-1 | OC-1 |
| 155.52 | STM-1 | STS-3 | OC-3 |
| 622.08 | STM-4 | STS-12 | OC-12 |
| 2488.32 | STM-16 | STS-48 | OC-48 |

Unlike conventional data transmission systems that derive transmission timing from the bit stream itself, SDH/SONET network elements derive their transmission timing from an external timing reference. More particularly, conventional data transmission systems transmit asynchronously, while SDH/SONET transmits synchronously.

Multiplexing signals in asynchronous timing systems requires storage buffers sufficiently large to store entire frames of information, which introduces significant time delays in the system. In contrast, multiplexing incoming signals in the SDH/SONET synchronous system requires only a few bytes of storage buffer to account for the relatively small timing differences.

However, the overall timing behavior of an SDH network is quite different from conventional asynchronous or Pleisochronous Digital Hierarchy networks. In particular, the generation, transmission, accumulation, and impact of timing jitter and wander on data services are fundamentally different. Jitter and wander impacts not only equipment manufacturers and network operators, but also end users, such as television broadcasters, who attempt to use such networks to deliver their signals with the highest quality.

Because the jitter and wander effect in SDH networks is so different, particularly SDH pointer jitter, this also impacts the test equipment used to install, qualify, and maintain hybrid SDH/PDH networks. New jitter and wander generation and measurement methodologies are required because existing methods are no longer suitable and may give unreliable results.

Jitter and wander are defined respectively as the short-term and the long-term variations of the significant instants of a digital signal from their ideal positions in time. For example, a digital signal continually varies in its time position by moving backwards and forwards relative to an ideal clocking source. Jitter and wander on a data signal are equivalent to a phase modulation of a clock signal used to generate the data.

Jitter and wander have both an amplitude—how much the signal is shifting in phase—and a frequency—how quickly the signal is shifting in phase. The standards define frequency variations changing at a rate above 10 Hertz as jitter and phase variations changing at a rate below 10 Hertz as wander. Amplitude is specified in unit intervals (UI), such that one UI of jitter is one data bit-width, irrespective of the data rate. Jitter amplitude is normally quantified as a peak-to-peak value rather than an RMS value because it is peak jitter that causes bit errors in network equipment.

Jitter measurements are made relative to a reference clock. By definition, a signal has no jitter when referenced to itself. Therefore, jitter and wander are measured as a phase or frequency difference between the signal being measured and the reference clock.

Excessive jitter and wander cause several problems including logical errors caused by decision circuits not operating at an optimum time; lost data caused by input buffers being either empty or overflowing, causing framing slips, data loss, or data repetition; and degradation in the reconstruction of encoded analog signals. The latter problem is not normally a problem for voice transmissions, but causes significant degradation of digitized television signals, which require high phase stability to convey color information.

Within a SDH/PDH network, many different mechanisms generate, transfer, and transform jitter and wander. In particular, at SDH cross connect, analog-to-digital, and terminating multiplexer nodes, SDH pointer jitter becomes a potentially serious problem. The pointer mechanism in SDH compensates for frequency and/or phase differences between incoming payloads and outgoing frames at such nodes. For example, even though separate SDH networks are synchronized from the same clock, when a payload is cross connected to a different SDH network, temperature variations cause changes in cable propagation delay that result in wander on the line and the clock. In addition, incoming payloads are typically not in phase with either each other or the outgoing SDH frames.

SDH pointers allow the payload to "float" within the SDH frame structure by introducing a step-change in payload phase, either advancing or retarding the payload by up to three bytes relative to the SDH frame. Such pointer movements can introduce significant amounts of jitter into the payload because they can insert a single block of 24 bits of phase justification into a signal, thereby causing a jitter impulse.

Generating and measuring such jitter is difficult because existing jitter generation and measurement instruments have nonideal responses below the typical 10 Hertz jitter/wander demarcation frequency. While this is not an issue in conventional asynchronous or PDH networks, the development of new services for these networks, especially video services, will require adherence to defined jitter tolerance standards. In SDH/PDH networks, jitter measurement response variations below 10 Hertz can significantly degrade measurement accuracy.

FIG. 1 shows a representative prior art jitter/wander generator circuit 10 employing a phase-lock loop (PLL) 12 that includes a phase detector 14, a phase summing node 16, a loop filter 18, a voltage controlled oscillator (VCO) 20, and a frequency dividers 22 and 26. A reference oscillator 24 is coupled to the phase detector 14 via the frequency divider 26. A direct digital synthesizer (DDS) 28 is coupled to the phase summing node 16 via a variable gain circuit 30. DDS 28 is coupled to a system clock 32. A clock signal is taken off of the output of the VCO 20 containing the jitter phase modulation.

The DDS 28 generates a sinusoidal output for phase modulating the jitter clock signal output of the VCO 20. The sinusoidal output of the DDS 28 is summed in the phase summing node 16 with the phase offset output of the phase detector 14. The output of the phase summing node 16 is coupled to the loop filter 18, which may be assumed to be a second order phase lock loop filter having an operational amplifier with a proportional integral control on the VCO 20. The frequency of the VCO 20 shifts in response to the loop filter 18 input to null the phase offset from the phase detector 14. The phase detector 14 senses the phase difference between the output of the reference oscillator 24 and the output of the VCO 20 and generates the phase offset output. The jitter clock output of the VCO 20 is phase modulated as a function of the sinusoidal output of the DDS 28.

This technique is limited in dynamic range by the dividers 22 and 26 and phase detector 14 dynamic range. If the jitter magnitude is desired to be large, a large divide by ratio must be used. This limits the frequency range and magnitude over which jitter can be generated. This also affects the stability of the jitter clock output of the VCO 20 with respect to the output of the reference oscillator 24. This technique generates jitter up to a frequency equal to the loop bandwidth of the phase lock loop 12. The magnitude of the jitter generation capability is constant over this range and can only be extended by increasing the divide ratio. Low frequency wander generation is typically of large amplitude. This requires a very large divide ratio which adversely affects the resolution and stability of the output.

Another disadvantage of the prior jitter/wander generator circuit 10 is in the area of automatic testing. Compliance standards have been established for jitter/wander for telecommunication devices and networks in which the peak-to-peak jitter magnitudes increases with the decrease in frequency of the jitter/wander signal. The divide ratio in circuit 10 is limited to meet the jitter/wander standards for higher frequencies. As the frequency of the jitter/wander signal decreases toward the wander region, the divide ratio has to change causing a loss of lock in the phase locked loop, which in turn interrupts the jittered clock output causing an interruption in the autotest.

A further disadvantage of the prior art jitter/wander generator circuit 10 is not having the capability of generating arbitrary wander waveforms of varying magnitude and frequency. An additional disadvantage is not having offset frequency capabilities nor having the capability of generating a clock output having parts per billion resolution.

What is needed, therefore, is a signal generator for generating a continuous clock output having phase modulation covering the total jitter/wander frequency range. Moreover, the signal generator should be capable of generating arbitrary wander waveforms as well as generating frequency offsets. Further, the signal generator should be capable of generating a clock output having parts per billion resolution.

SUMMARY OF THE INVENTION

Accordingly, the present invention is directed toward a signal generator for generating a variable phase/frequency output that includes a variable reference oscillator, a variable oscillator and a phase locked loop. The variable reference oscillator generates a reference having a varying phase offset over a first phase modulation frequency interval and a constant output over a second phase modulation frequency interval. The variable oscillator generates a constant output over the first phase modulation frequency interval and a variable output over the second phase modulation frequency interval. The phase locked loop has a phase detector, a phase summing node and an oscillator. The phase detector receives the outputs of the variable reference oscillator and the oscillator and the phase summing node receives the outputs of the variable oscillator and the phase detector. The output of the phase locked loop tracks the variable reference oscillator over the first phase modulation frequency interval and generates a phase modulated output in response to the variable output of the variable oscillator over the second phase modulation frequency interval.

The variable reference oscillator includes a phase locked loop for generating the reference and a direct digital synthesizer coupled to the phase locked loop for generating an output for varying the phase offset of the reference over the first phase modulation frequency interval. The output of the direct digital synthesizer phase modulates the variable reference oscillator over the first phase modulation frequency interval and/or offsets the frequency of the variable reference oscillator. The direct digital synthesizer may be implemented with a look-up table for generating a sinusoidal output for varying the phase offset of the reference over the first phase modulation frequency interval.

The variable reference oscillator may be further implemented with a digital signal processor coupled to the direct digital synthesizer for generating frequency updates to the direct digital synthesizer for generating the output for varying the phase offset of the reference over the first phase modulation frequency interval. The digital signal processor has a sample rate for generating the frequency updates to the direct digital synthesizer wherein the output of the direct digital synthesizer is a function of the frequency updates. The phase offset at the reference output is essentially the integral of the offset from the nominal of the frequency updates to the DDS with the frequency updates occurring at a rate substantially greater than the first phase modulation frequency interval. Operating under the control of the digital signal processor at this frequency update rate, the direct digital synthesizer can generate an arbitrary waveform output over this frequency interval.

The phase locked loop includes variable dividers respectively coupled between the variable reference oscillator and the phase detector and between the phase locked loop oscillator and the phase detector with the phase locked loop oscillator being a voltage controlled oscillator having an octave bandwidth. A variable divider may be coupled to the output of the phase locked loop or to the output of the variable reference oscillator for producing in combination with the variable reference oscillator having a direct digital synthesizer and the phase locked loop an output having parts per billion resolution within the frequency limits of the signal generator.

An object of this invention is to provide a signal generator for producing jitter and wander on electrical signals.

Another object of this invention is to provide a signal generator for producing jitter and wander on a digital signal as well as frequency offsets.

A further object of this invention is to provide a signal generator capable of generating arbitrary wander waveforms of arbitrary magnitude.

Still another object of this invention is to provide a digitally controlled variable reference oscillator for providing a precision controlled output.

Additional objects and advantages of this invention will be apparent from the following detailed description of a preferred embodiment thereof that proceeds with reference to the accompanying drawings.

BRIEF DESCRIPTION OF THE DRAWINGS

FIG. 6 is a table of the parameter values for jitter and wander tolerances for PDH equipment.

DETAILED DESCRIPTION OF THE PREFERRED EMBODIMENT

Figure 2:
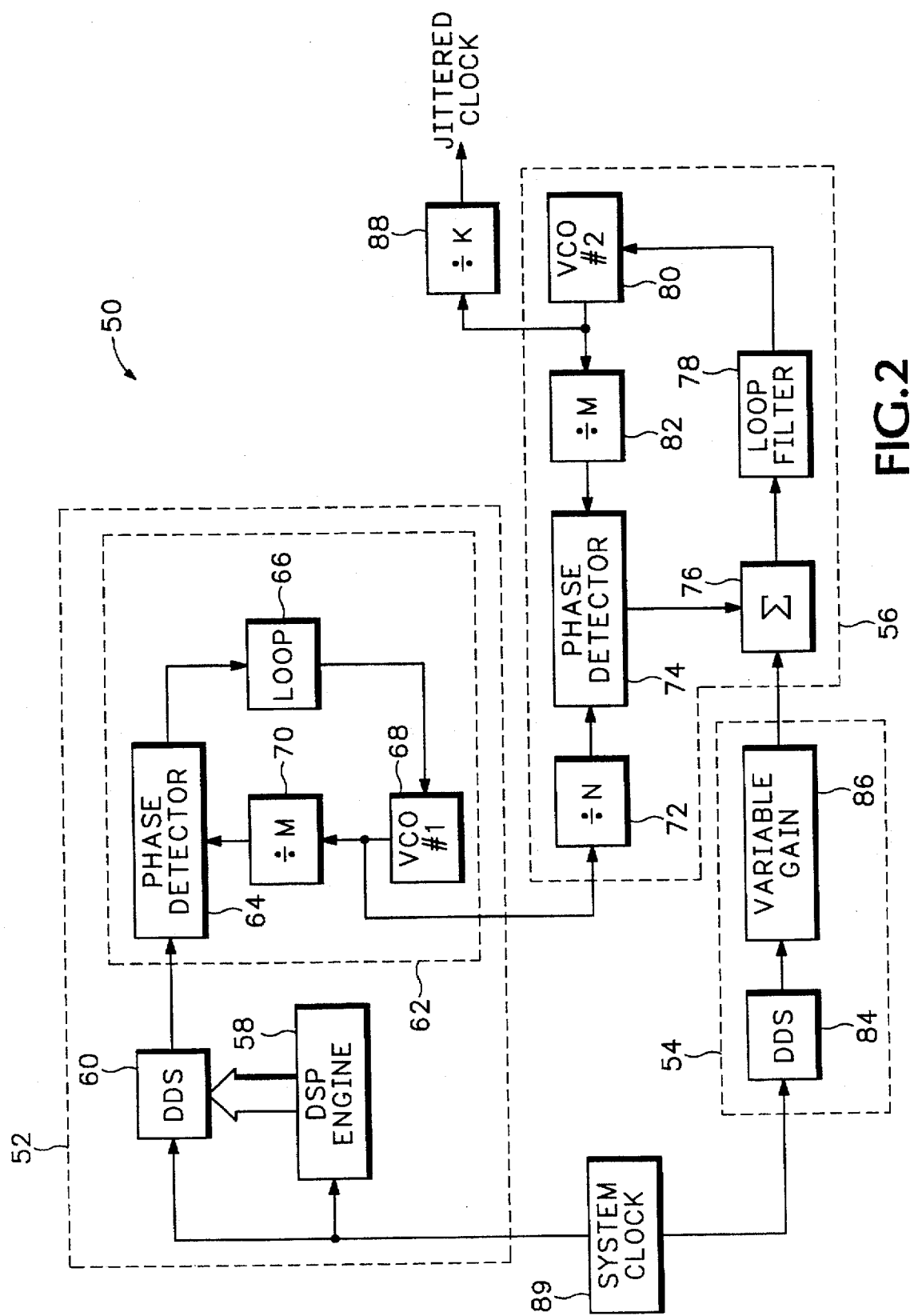
FIG. 2 is a block diagram of the jitter/wander generator according to the present invention.

Referring to FIG. 2, there is shown a preferred embodiment of the signal generator 50 for producing an output having varying phase and/or frequency offsets. The signal generator 50 has a variable reference oscillator 52, a variable oscillator 54 and a phase locked loop (PLL) 56. The variable reference oscillator 52 includes digital signal processing engine (DSP) 58 coupled to a direct digital synthesizer (DDS) 60. The direct digital synthesizer 60 is coupled to a phase locked loop (PLL) 62 having a phase detector 64, a loop filter 66, a voltage controlled oscillator (VCO) 68 and a programmable divider 70. The output of the variable reference oscillator 52 is coupled to the phase locked loop 56 via a programmable divider 72 in loop 56. The phase locked loop 56 also includes a phase detector 74, a summing circuit 76 acting as a phase summing node, a loop filter 78, a voltage controlled oscillator (VCO) 80, and a programmable divider 82. The phase summing node 76 receives an input from the variable oscillator 54 that includes a direct digital synthesizer 84 and a variable gain circuit 86. The output of the phase locked loop 56 is the clock output of the signal generator 50. A programmable divider 88, to be discussed in greater detail below, may be added to the signal generator 50 for producing any frequency within the frequency limits of the signal generator at parts per billion resolution. A system clock 89 is coupled to the variable reference oscillator 52 and variable oscillator 54.

Figure 1:
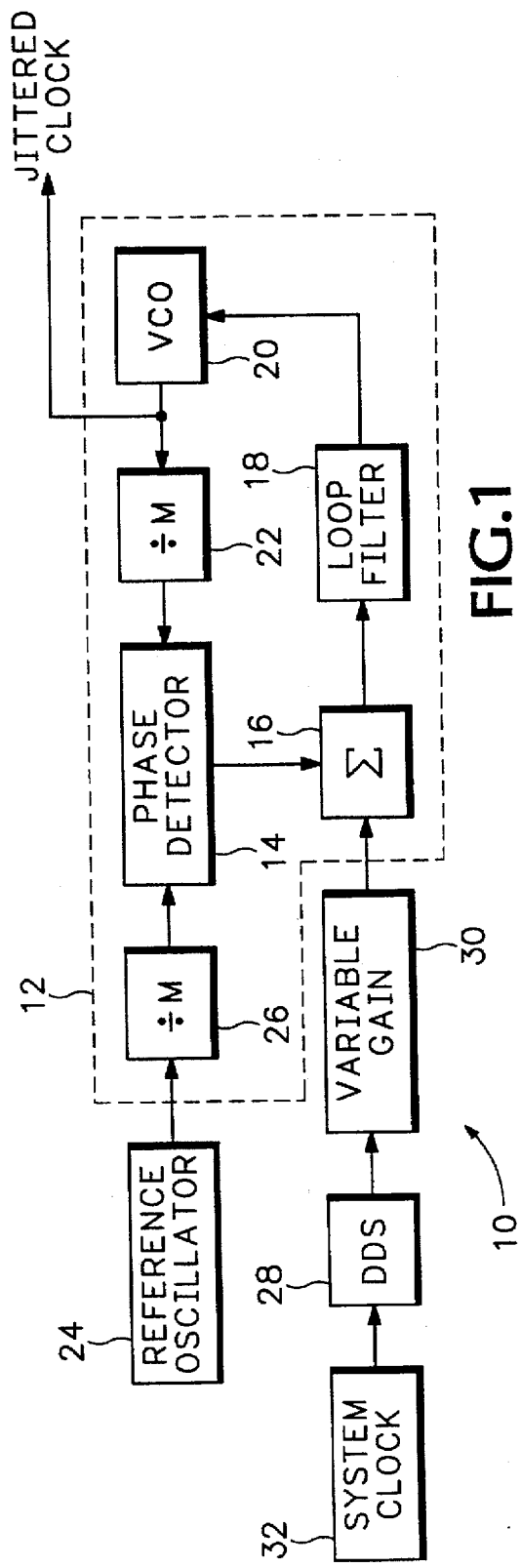
FIG. 1 is a block diagram of a representative prior art jitter/wander generator.
Figure 5:
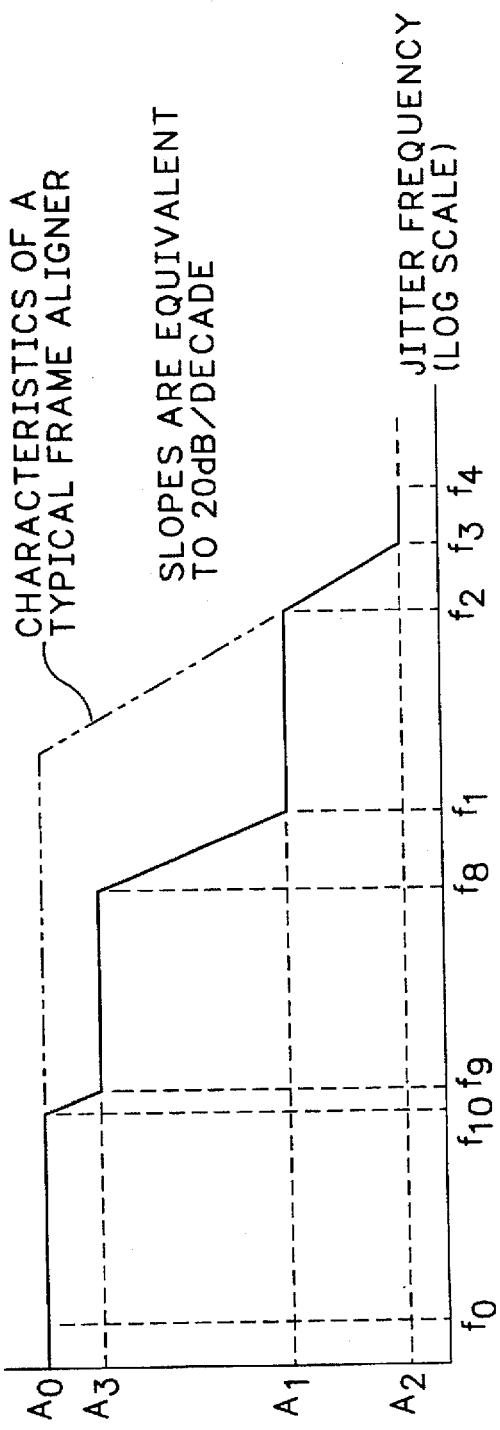
FIG. 5 is a graphical representation of the parameter values for jitter and wander tolerances for PDH equipment.
Figures 3, 4:
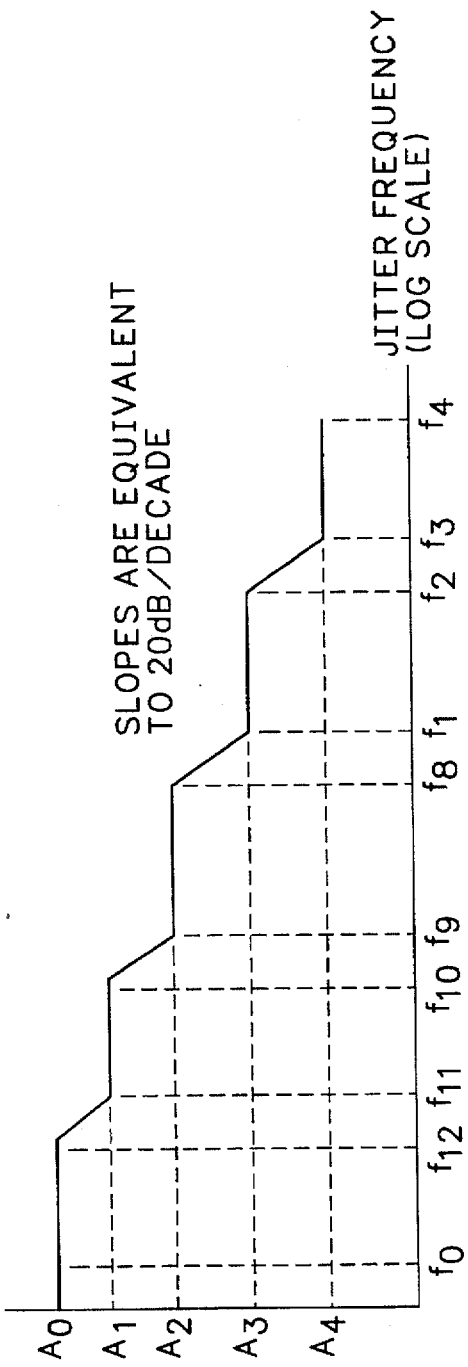
FIG. 3 is a graphical representation of the parameter values for jitter and wander tolerances for SDH equipment.
FIG. 4 is a table of the parameter values for jitter and wander tolerances for SDH equipment.

The signal generator 50 generates a clock output that is phase modulated over a range coveting the jitter/wander compliance standards for the telecommunications industry. The standards define the amount of jitter/wander acceptable in network components and the overall network in terms of frequency variation and magnitude. FIGS. 3 is a SDH/SONET template from the G.825 standard of the International Telecommunications Union showing the frequency variations values and the corresponding magnitudes for jitter and wander. FIG. 4 is a table from the same standard correlating the specific levels on the template to frequency variations and magnitude levels. FIGS. 5 and 6 are a respective template and a frequency variation and magnitude level chart for PDH components and systems from the G.823 standard of the International Telecommunications Union. The charts and tables show that as the frequency variation (the amount of phase modulation on the clock signal) decreases, the magnitude of the phase modulation increases. As was previously described, prior art jitter/wander generators could not generate a continuous jitter/wander clock output due to the need to change the divide ratio at the lower phase modulation frequencies.

The signal generator 50 of the present invention provides continuous generation of a jitter/wander clock over the complete range of frequency variations and magnitudes of the jitter/wander compliance standards. The variable reference oscillator 62 generates a reference having a varying phase offset over a first phase modulation frequency interval and a constant output over a second phase modulation frequency interval. The first and second phase modulation frequency intervals relate to the frequency of the phase modulation added to the clock output of the signal generator 50. The variable oscillator 54 generates a constant output over the first phase modulation frequency interval and a variable output over the second phase modulation frequency interval. The phase locked loop 56 whose output is taken off of the voltage controlled oscillator 80 tracks the variable reference oscillator over the first phase modulation frequency interval and generates a phase modulated output in response to the variable output of the variable oscillator over the second phase modulation frequency interval. The cross-over frequency between the first and second phase modulation frequency intervals is a function of the loop bandwidths of the voltage controlled oscillators 66 and 80, the divide ratios of the oscillators, and the frequency update rate of the DSP 58. Therefore, the cross-over frequency is optimized for the components used in the signal generator. In the preferred embodiment, the cross-over frequency is in the range of 50 Hz.

Figures 6A, 7:
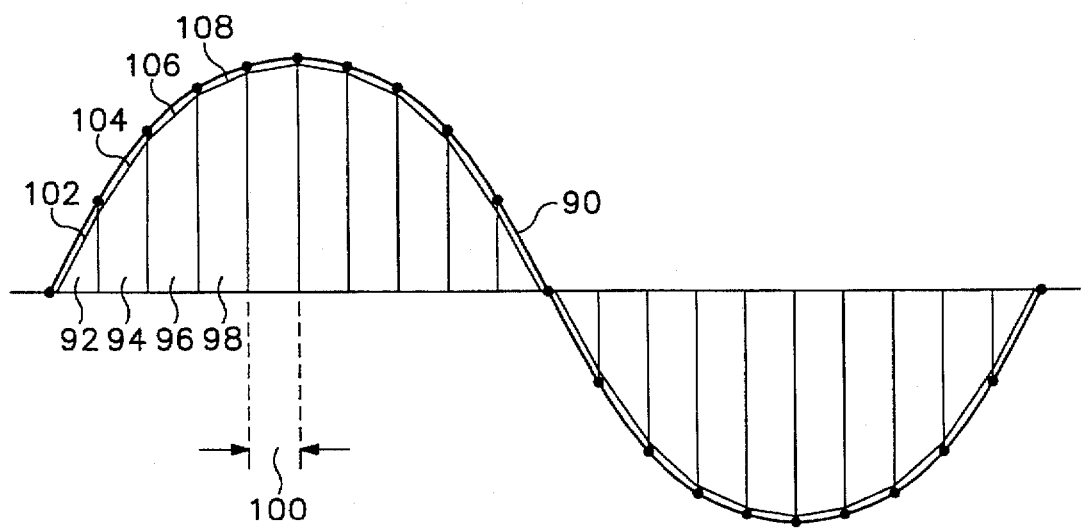
FIG. 7 is graphical representation of the generation of the direct digital synthesizer output using frequency updates from a digital signal processor according to the present invention.

The DSP 58 generates frequency update values in response to inputs from a controller, such as a microprocessor (not shown). The sample rate of DSP 58 should be significantly higher than the highest phase modulation frequency to be generated by the DDS 60 over the first phase modulation frequency interval. The frequency update rate needs to occur at a rate much higher than two times the first phase modulation frequency interval. In the preferred embodiment, the frequency update rate is 1 KHz, which translates into generating frequency update values at 1 msec intervals. The DDS 60 generates a sinusoidal output that is phase modulated with a sinusoidal or arbitrary waveform output as a function of the frequency update values for phase modulating the reference output of VCO 68. FIG. 7 is a representation of sinusoidal wander curve 90 for generating phase modulation over the first phase modulation frequency interval. The curve 90 is divided into a number of time interval segments, represented by 92, 94, 96, 98, 100, as a function of the DSP 58 sample rate. A table stored in ROM (not shown) associated with the microprocessor contains the phase modulation to be generated. The DSP 58 generates new frequency update values on each clock cycle of the DSP 58 based on the phase modulation table. Since phase is the integral of frequency, generating a frequency deviation over each time interval segment will integrate up and approximate the sinusoidal phase modulation curve by a series of straight lines, represented by 102, 104, 106, 108. Arbitrary phase modulation curves can be generated from the DDS 60 using the same process for generating sinusoidal phase modulation curves. The arbitrary waveforms may be stored in tables, such as for sinusoidal curves, or the DSP 58 can generate random curves based on an internal random number generator.

Alternately, if the DDS 60 is generating sinusoidal curves and not arbitrary curves, then the DDS 60 may be coupled to receive an input directly from a microprocessor. A set of look-up tables are provided in ROM associated with the microprocessor for generating the sinusoidal waveforms. The microprocessor under program control accesses the tables and passes the table information to the DDS 60. The DDS 60 generates the sinusoidal curve in response to the table data.

The phase detector 64 in PLL 62 receives the output from the DDS 60 and the output of VCO 68 via the programmable divider 70. The phase detector 64 detects the phase offset between the input waveform of the DDS 60 and the output of the VCO 68. The loop filter 66, which in the preferred embodiment is a second order loop filter having an operational amplifier with a proportional integral control on the VCO 68 receives the phase offset from the phase detector 64. The output of the loop filter 66 varies the frequency of the VCO 68 in an attempt to null the phase offset from the phase detector 64. The phase detector 64 generates a varying phase offset as a function of the output from the DDS 60 that phase modulates the VCO 68 reference over the first phase modulation frequency interval. The DDS 60 generates a constant output over the second phase modulation frequency interval producing a constant reference output from the VCO 68.

PLL 56 receives the output of VCO 68 at phase detector 74 via the programmable divider 72. The other input to the phase detector 74 is the output from the VCO 80 coupled through programmable divider 82. The phase detector 74 detects the phase difference between the reference from the variable reference oscillator 52 and the output of VCO 80 and generates an output that is coupled to the phase summing node 76. The phase summing node 76 also receives an input from the variable oscillator 54 whose output is constant, preferably zero, over the first phase modulation frequency interval and a sinusoidal output over the second phase modulation frequency interval. The output of the variable oscillator 54 is added to the output of the phase detector 74 in the phase summing node 76 and coupled to the loop filter 78. The loop filter 78, which in the preferred embodiment is a second order loop filter having an operational amplifier with a proportional integral control on the VCO 80, generates an output for varying the frequency of the VCO 80 in an attempt to null the summed phase offset from the phase detector 64 and the output of the variable oscillator 54. Because the variable oscillator 54 is not generating a sinusoidal output over the first phase modulation frequency interval, PLL 56 tracks the output of the variable reference oscillator 52 over the first interval and generates a phase modulated output from VCO 80 that is a function of the varying phase offset generated by the phase detector 74 in response to the variable reference oscillator output. Over the second phase modulation frequency interval the variable reference oscillator 52 generates a constant output and the PLL 56 generates a phase modulated output from VCO 80 that is a function of the varying phase offset generated by the phase detector 74 in response to the summed phase detector 74 output and the sinusoidal output of the variable oscillator 54.

In addition to generating an output for varying the phase offset of the VCO 68 reference, the DDS 60 can offset the frequency of the variable reference oscillator 52. The DSP 58, under microprocessor control, receives commands for generating a frequency update value that is coupled to the DDS 60. The DDS 60 generates an output for offsetting the frequency of VCO 68 in response to the DSP 58 frequency update value. The DDS 60 output causes the phase detector 64 to generate a phase offset that is coupled via the loop filter 66 to the VCO 68, which nulls the phase offset by changing its frequency output. Alternately, the DDS 60 may be coupled to receive commands directly from the microprocessor for generating the output for offsetting the frequency of the variable reference oscillator 52. The microprocessor can access a table of frequency offsets stored in ROM or receive input from front panel controls associated with a measurement test instrument containing the signal generator 50 of the present invention.

The direct digital synthesizers 60 and 84 used in the signal generator 50 of the present design are manufactured and sold by Analog Devices under part Number AD7008. The programmable dividers 70, 72, 82, and 88 are E116 programmable dividers, manufactured and sold by Motorola. The voltage controlled oscillators are manufactured and sold by Zcomm under part number V637M and have an octave bandwidth. Phase detectors 64 and 74 are manufactured and sold by Motorola under part number MCK12140. The variable gain device 86 and the loop filter amplifiers 66 and 78 are manufactured and sold by Analog Devices under respective part numbers AD602 and AD847. The digital signal processor 58 is a 56K Series DSP manufactured and sold by Motorola. A representative microprocessor for providing input to the DSP 58, the programmable dividers 70, 72, and 82, the variable gain device 86 and the DDSs 60 and 84 is a 68020 manufactured and sold by Motorola. Other devices and components having the same or similar characteristics and manufactured by the same on other companies may be used for implementing the signal generator 50 of the present invention.

The signal generator 50 according to the present invention generates clock outputs covering DS1 (1.544 MHz) through STM-4 (622.08 MHz) clock rates. The signal generator 50 may be included in a jitter/wander measurement instrument where the various bit rates are selectable using front panel instrument controls. The signal generator 50 generates these various clock rates by varying the DDS 60 input to PLL 62 and varying the divide by ratios of the programmable dividers 70, 72 and 82 in PLLs 62 and 56. The function for frequency output ($f_{out}$) of a phase locked loop is:

$$f_{out} = \frac{M}{N} f_{ref}$$

where $f_{out}$ is the frequency output of the PLL, M is the divide by value of the divider in the loop feedback, N is the divide by value of the divider in the reference input and $f_{ref}$ is the frequency of the reference input. For a 155.52 MHz STM-1 clock rate, DSP 58 generates frequency update value or values (constant multiple values if updating the DDS 60 at the 1 KHz rate) for producing a 4.86 MHz output from the DDS 60. The DDS 60 output is input as a reference to PLL 62, which has a loop bandwidth in the range of 10 KHZ. The divide by (N) value for PLL 62 is 1 being that reference input is not divided. The divide by (M) value for the programmable divider 70 is 128. The PLL 62 output taken off of VCO 68 is 622.08 MHz, the reference input times the divide by (M) value. PLL 56 receives the 622.08 MHz output from PLL 62 at divider 72 that has a divide by (N) value of 16. Divider 82 has a divide by (M) value of 16. The ratio of M divided by N equals 1 which is multiplied by the 622.08 MHz reference input from PLL 62 to produce the 622.08 MHz output taken off of VCO 80. A programmable divider 88 is set to 4, which divides the 622.08 MHz VCO 80 output to produce the 155.52 MHz clock output.

Phase modulation jitter and wander are added to the 155.52 MHz clock output by the DSP generating frequency update values for the DDS 60 over the first phase modulation frequency interval which in the preferred embodiment has an upper end phase modulation frequency of 50 Hz. The DSP cycle rate is 1 KHZ providing frequency update values to the DDS 60 every 1 msec. The DDS 60 adds the phase modulation to the reference input to the PLL 62 by approximating a phase modulation curve using straight lines. The phase modulation curve generated by the DDS 60 is a function of the frequency update values provided by the DSP 58. Since phase is the integral of the frequency, the DDS 60 integrates the frequency deviation defined by the frequency update values over the DSP 58 cycle periods. The phase modulated output of DDS 60 is coupled to the PLL 62 which tracks the varying phase offsets of the DDS 60 output. PLL 56 receives the output of the variable reference oscillator 52 and tracks the varying phase offsets in the output of the variable reference oscillator 52 over the first phase modulation frequency interval. During the first phase modulation frequency interval, variable oscillator 54 generates a constant output that does not add phase modulation to the 622.08 MHz clock signal. The output of PLL 56 is the 622.08 MHz clock signal containing the variable phase offsets generated by the variable reference oscillator 52. Divider 88 divides the PLL 56 output down to 155.52 MHz.

DSP 58 generates a constant frequency update value for the DDS 60 for producing a constant output reference to the PLL 62 over the second phase modulation frequency interval. PLL 62 generates a constant output in response to the DDS 60 input that is coupled to PLL 56. PLL 56 receives a sinusoidal phase modulation signal over the second phase modulation frequency interval from the variable oscillator 54 coupled to the phase summing node 76. DDS 84 receives instructions and look-up table date from a microprocessor for generating the sinusoidal phase modulation signal. The magnitude of the sinusoidal phase modulation signal from DDS 84 is varied by the variable gain circuit 86 controlled by a microprocessor. The sinusoidal phase modulation signal is added to the phase offset from phase detector 74 in the phase summing node 76. PLL 56 tracks the phase modulation produced by the phase modulation signal from DDS 54 over the second phase modulation frequency interval.

An added feature of the signal generator 50 is the addition of the programmable divider 88 on the output of the PLL 56, or optionally on the output of the variable reference oscillator 52. Divider 88 in combination with DDS 60, which provides a wide range of frequency offset at very fine resolution, a voltage controlled oscillator 80 having an octave bandwidth, and arbitrary divide by ratios for the phase locked loops 56 and 62 generates any frequency within the frequency limits of the signal generator at parts per billion resolution.

A signal generator 50 has been described having a variable reference oscillator, a variable oscillator, and a phase locked loop for generating a continuous clock output having phase modulated jitter and wander. The variable reference oscillator includes a digital signal processor and a direct digital synthesizer for generating an input reference to a phase locked loop. The digital signal processor provides frequency update values to the direct digital synthesizer for integrating frequency variations over defined time intervals between the update values for producing a phase modulated output from the direct digital synthesizer. The variable reference oscillator generates a reference having a varying phase offset over a first phase modulation frequency interval and a constant output over a second phase modulation frequency interval. The phase modulation frequency intervals are the range of phase modulation frequencies impressed on the clock output with the preferred embodiment of the invention having a first interval covering a frequency range from zero to approximately 50 Hz and the second interval starting at approximately 50 Hz and continuing upward. The variable generator having a direct digital synthesizer and a variable gain circuit generates a constant output over the first phase modulation frequency interval and a sinusoidal output over the second phase modulation frequency interval. The phase locked loop tracks the variable reference oscillator over the first phase modulation frequency interval and generates a phase modulated output in response to the variable oscillator over the second phase modulation frequency interval. The present invention further provides for generating frequency offsets to the clocked output and parts per billion resolution of the clock output within the frequency limits of the signal generator.

It will be obvious to those having skill in the art that many changes may be made to the details of the above-described embodiment of this invention without departing from the underlying principles thereof. The scope of the present invention should, therefore, be determined only by the following claims.

What is claimed is:

1. An signal generator for generating a variable phase/frequency output comprising:

a variable reference oscillator for generating a reference having a varying phase offset over a first phase modulation frequency interval and a constant output over a second phase modulation frequency interval;

a variable oscillator for generating a constant output over the first phase modulation frequency interval and a variable output over the second phase modulation frequency interval; and a phase locked loop having a phase detector, a phase summing node and oscillator with the phase detector coupled to receive the outputs of the variable reference oscillator and the oscillator, and phase summing node coupled to receive the outputs of the variable oscillator and the phase detector wherein the output of the phase locked loop tracks the variable reference oscillator over the first phase modulation frequency interval and generates a phase modulated output in response to the variable output of the variable oscillator over the second phase modulation frequency interval.

2. The signal generator of claim 1 wherein the variable reference oscillator comprises:

a phase locked loop for generating the reference; and a direct digital synthesizer coupled to the phase locked loop for generating an output for varying the phase offset of the reference over the first phase modulation frequency interval.

3. The signal generator of claim 2 wherein the output of the direct digital synthesizer phase modulates the variable reference oscillator over the first phase modulation frequency interval.

4. The signal generator of claim 2 wherein the output of the direct digital synthesizer offsets the frequency of the variable reference oscillator.

5. The signal generator of claim 2 wherein the output of the direct digital synthesizer phase modulates the variable reference oscillator over the first phase modulation frequency interval and offsets the frequency of the variable reference oscillator.

6. The signal generator of claim 2 wherein the direct digital synthesizer further comprises a look-up table for generating a sinusoidal output for varying the phase offset of the reference over the first phase modulation frequency interval.

7. The signal generator of claim 2 wherein the variable reference oscillator further comprises a digital signal processor coupled to the direct digital synthesizer for generating frequency updates to the direct digital synthesizer for generating the output for varying the phase offset of the reference over the first phase modulation frequency interval.

8. The signal generator of claim 7 wherein the digital signal processor has a sample rate for generating the frequency updates to the direct digital synthesizer wherein the output of the direct digital synthesizer is a function of the frequency updates producing the varying phase offset in the reference.

9. The signal generator of claim 7 wherein the output of the direct digital synthesizer is phase modulated by an arbitrary waveform output over the first phase modulation frequency interval.

10. The signal generator as recited in claim 2 wherein the phase locked loop further comprises variable dividers respectively coupled between the variable reference oscillator and the phase detector and between the phase locked loop oscillator and the phase detector with the phase locked loop oscillator being a voltage controlled oscillator having an octave bandwidth.

11. The signal generator as recited in claim 10 further comprising a variable divider coupled to the output of the phase locked loop that in combination with the variable reference oscillator having a direct digital synthesizer and the phase locked loop generates any frequency within the limits of the signal generator having parts per billion resolution.

12. The signal generator as recited in claim 10 further comprising a variable divider coupled to the output of the variable reference oscillator that in combination with the variable reference oscillator having the direct digital synthesizer and the phase locked loop generates any frequency within the limits of the signal generator having parts per billion resolution.

* * * * *